United States Patent [19]

Oyama

[11] Patent Number: 5,636,168

[45] Date of Patent: Jun. 3, 1997

[54] METHOD FOR TESTING A NONVOLATILE SEMICONDUCTOR MEMORY DEVICE

[75] Inventor: Ken-Ichi Oyama, Tokyo, Japan

[73] Assignee: NEC Corporation, Tokyo, Japan

[21] Appl. No.: 547,322

[22] Filed: Oct. 24, 1995

[30] Foreign Application Priority Data

Oct. 24, 1994 [JP] Japan ................................. 6-257808

[51] Int. Cl.⁶ ................................................. G11C 11/40
[52] U.S. Cl. .................... 365/201; 365/218; 365/230.06; 365/185.3
[58] Field of Search ................................. 365/200, 201, 365/230.01, 189.01

[56] References Cited

U.S. PATENT DOCUMENTS

| 5,122,985 | 6/1992 | Santin | 365/185 |
| 5,313,432 | 5/1994 | Lin et al. | 365/230.06 |
| 5,371,706 | 12/1994 | Frentz et al. | 365/201 |

OTHER PUBLICATIONS

P. Cappelletti et al., "CAST: An Electrical Stress Test to Monitor Single Bit Failures in Flash–EEPROM Structures", The 13th Annual IEEE Nonvolatile Simiconductor Memory Workshop, (1994) pp. 1–3.

*Primary Examiner*—Viet Q. Nguyen
*Attorney, Agent, or Firm*—Foley & Lardner

[57] ABSTRACT

A method for testing nonvolatile memory device includes the steps of forming a block including a test row and a first and a second decoding row, by connecting the sources of the memory cells in the test row together to form a common source line, connecting each column of memory cells in the three rows in series, connecting the drains of the memory cells in the second decoding row together to form a common drain line, erasing the memory cells in the first and second decoding rows, successively programming and erasing the memory cells in the test row, and measuring a first drain current flowing through the common drain line with respect to the voltage of the word line of the test row. If the first drain current exhibits a negative threshold voltage, an over-erased memory cell exists in the test row. Thereafter, the total drain current of the memory cell other than the over-erased memory cell and the drain current of the over-erased memory cell can be separately measured for analyzing the tunnel oxide film of the memory cells.

5 Claims, 6 Drawing Sheets

METHOD FOR TESTING A NONVOLATILE SEMICONDUCTOR MEMORY DEVICE

BACKGROUND OF THE INVENTION (a) Field of the Invention

The present invention relates to a method for testing a nonvolatile semiconductor memory device and, more particularly, to a method for testing a nonvolatile semiconductor memory device, such as a flash memory, which has an array of memory cell transistors each capable of accumulating charge therein for programming.

(b) Description of the Related Art

A nonvolatile semiconductor memory device, such as a flash memory, capable of erasing whole programmed data at a time includes a plurality of memory cells, each composed of a MOS FET having a polycrystalline silicon double-layer gate structure. The double-layer gate structure is composed of a tunnel oxide film, a floating gate made of polycrystalline silicon, an inter-gate insulating film, and a control gate made of polycrystalline silicon. These are formed on a p-type silicon substrate, by using a silicon thermal oxidation technique, a thin film forming technique such as CVD, photolithography, a thin film dry etching technique, and the like. The source and drain diffusion regions of the MOS FET are formed by an ion implantation technique using phosphorous or arsenic dopant.

To program a memory cell, the source electrode (hereinafter, simply referred to as "source", the same simplification will be applied to other electrodes) of the memory cell is grounded, and the drain and control gate of the memory cell are supplied with high voltages, for example, 6 V and 12 V, respectively, so as to inject channel hot electrons, which are generated at the drain-side end of the channel of the memory cell, into the floating gate, thereby increasing the threshold voltage of the memory cell as viewed from the control gate. To erase a memory cell, a negative high voltage of about −20 V is applied to the control gate, or a positive high voltage of about 7 V is applied to the source so as to discharge electrons accumulated on the floating gate by utilizing the Fowler-Nordheim tunnel effect, thereby decreasing the threshold voltage of the memory cell as viewed from the control gate.

In a nonvolatile semiconductor memory device having a memory array in which memory cells each having a structure as described above are disposed in a matrix, namely, in the row and column directions, more specifically, in a flash memory, a plurality of memory cells can be erased together at a time. In this case, however, the threshold voltages of the memory cells after the erasure vary depending on a variation in the erasing characteristics of the memory cells. If the variation is too large, some of the memory cells will have a threshold voltage lower than 0 V after the erasing operation, which state is generally called over-erasure. If an over-erased memory cell exists in a memory cell array due to an overall erasure operation, it will be impossible to read out data from the remaining memory cells which are connected to the same bit line to which the over-erased memory cell is connected.

To overcome the problem as described above, it is necessary prior to a commercial production to measure the erasing characteristics of many memory cells each having a similar size, cheek the variation in the thresholds of the memory cells after an overall erasure operation, and analyze the cause of the variation. However, when a large scale test pattern is prepared including a memory block of an actual memory cell array and a control circuit for controlling the memory cell array, time period required for manufacture of the test pattern will be large, which greatly decreases the efficiency of the analysis of the nonvolatile memory device. Accordingly, a test pattern and a program for test procedure thereof have been desired which can efficiently evaluate the variation in the erasing characteristics of the nonvolatile semiconductor memory device.

FIGS. 1A and 1B are circuit diagrams of a memory cell block or row in a nonvolatile semiconductor memory device to be tested. These figures show the block at the steps in a test method called CAST (cell array stress test) in which memory cells in each block are connected in parallel (refer to P. Cappelletti et al., "CAST: an electrical stress test to monitor single bit failures in flash-EEPROM structures", The 13th Annual IEEE Nonvolatile Semiconductor Memory Workshop, 1994).

In the test method for a nonvolatile semiconductor memory device as mentioned above, a test block or test row R1 is formed including a plurality of memory cells MC arrayed in a row and each having a control gate CG connected together, as shown in FIG. 1A. The sources S of the memory cells MC in the test row R1 are connected together to form a common source line 12 connected to the ground GND, while the drains of the memory cells MC in the test row R1 are connected together to form a common drain line 13. After initializing the memory cells MC in the test row R1 into programmed states, a gate voltage VG of about −20 V is applied to the word line 14 while maintaining the common drain line 13 in an open state or floating state (OP), to thereby erase the memory cells MC of the test row R1.

Subsequently, as shown in FIG. 1B, a programming supply voltage ($V_D$) of about 1 V is applied to the common drain line 13, following which the voltage (VG) applied to the word line 14 is gradually raised while measuring current ID flowing through the common drain line 13, which current is the sum of the drain current of all the memory cells MC in the test row R1. The current will be referred to as total drain current, hereinafter.

FIG. 2 is presented for explaining expected curves of the measured total drain current ID as a function of the gate voltage VG1 in the test as described above, in which curve I including a solid line section Ia and a broken line section Ib represents a transfer characteristic of an over-erased memory cell, curve II including a solid line section IIa and a broken line section IIb represents the total drain current after erasure of the test row including no over-erased memory cell, and curve III represents the total drain current before an overall erasure or after overall programming. As is understood from FIG. 2, an over-erased memory cell exhibits a negative threshold characteristic in which it provides drain current at a negative gate voltage to show the defect therein.

If an over-erased memory cell 11 exists in the test row R1 having a negative threshold voltage, which is sometimes caused by the prior overall erasing operation, the total drain current ID varies along the solid line section Ia of curve I and then along the solid line section IIa of curve II as the ate voltage VG1 increases. On the other hand, if there is no over-erased memory cell, the total drain current ID varies along broken line section IIb and then solid line section IIa of curve II. Based on the difference between these characteristic curves, it can be judged whether or not an over-erased cell exists in the test row R1.

The conventional test method as described above is used because the structure of a test block and the procedures of the test is simple. Namely, it is unnecessary to prepare a large scaled test pattern so that the processing time required for the trial manufacture can be small and the evaluation and analysis of the test block can be performed efficiently.

In the conventional method as described above, only the total drain current of the test block is measured after the erasing operation. That is, it is impossible to separately measure the characteristics of the over-erased memory cell 11 and the characteristics of other normally erased memory cells although it is possible to judge whether or not an over-erased memory cell exists. It is, however, desired to measure the tunnel current characteristic of the tunnel oxide film of the over-erased memory cell for a further analysis on the erasing characteristic of the over-erased memory cell to thereby manufacture a nonvolatile memory cell device having stable programming and erasing characteristics.

If the analysis of tunnel current characteristic of the tunnel oxide film is desired for the over-erased cell by using the conventional method, a large scale pattern must be prepared, and the erasing characteristics of all the memory cells must be measured one by one in the test row. In this case, after localizing an over-erased cell based on the results of the measurement, a further measurement must be performed on the tunnel characteristic of the tunnel oxide film of the localized memory cell. Due to these complex steps, the efficiency of the analysis greatly decreases.

SUMMARY OF THE INVENTION

In view of the foregoing, it is an object of the present invention to provide an improved method for testing a nonvolatile semiconductor memory device which can judge whether or not an over-erased memory cell exists and which separately measure the characteristics of the detected over-erased memory cell and the characteristics of other normally erased memory cells, thereby making it possible to efficiently perform a comparative evaluation, analysis and the like on the tunnel oxide film of each memory cell.

In accordance with the present invention, there is provided a method for testing a nonvolatile semiconductor memory device having a memory cell array in which a plurality of memory cells are arranged in a matrix, each of said memory cell being composed of a transistor having a control gate, a source, a drain and a charge storing layer capable of storing charge thereon, the gate of memory cells in a row is connected together to form a word line.

The method includes the steps of:

forming a test block by selecting three of rows including a test row and a first and a second decoding rows from said memory cell array, connecting the sources of the memory cells together in said test row to form a common source line, connecting each of the drains of the memory cells in said test row to a corresponding one of the sources of the memory cells In said first decoding row, connecting each of the drains of the memory cells in said first decoding row to a corresponding one of the sources of the memory cells in said second decoding row, and connecting the drains of the memory cells together in said second decoding row to form a common drain line;

erasing the memory cells in said first and second decoding rows, programming the memory cells in said test row and erasing the programmed memory cells in said test row; and measuring a first characteristic of drain current flowing through said common drain line with respect to the voltage of the word line of said test row.

A preferred embodiment of the present invention further includes the steps of:

programming one of the memory cells in the first decoding row corresponding to an over-erased memory cell, if it is judged based on the first characteristic that the over-erased memory cell exists, while maintaining the over-erased memory cell and remaining memory cell in the test row in ON and OFF states, respectively, and the memory cells in the second decoding memory in ON states; and after the programming of the one of the memory cell, measuring a second characteristic of drain current flowing through the common drain line with respect to the voltage of the word line of the test row, while maintaining the common source line and the common drain line at the reference potential and the first potential, respectively, and maintaining the memory cells in the first and second decoding rows in ON states.

A preferred embodiment of the present invention further includes the steps of:

programming the memory cells except one in the second decoding row corresponding to the over-erased memory cell in the test row;

erasing the memory cells in the first decoding row; and after the programming of the memory cells except one and erasing the memory cells in the fist decoding row, measuring a second characteristic of drain current flowing through the common drain line with respect to the voltage of the word line of the test row, while maintaining the common source line and the common drain line at the reference potential and the first potential, respectively, and maintaining the memory cells in the first and second decoding rows in ON states.

According to the method of the present invention, the electric characteristics of an over-erased memory cell and the electric characteristics of the remaining memory cells can be measured separately by forming the test block having a relatively simple structure and by performing a relatively simplified test procedure. Therefore, it is feasible to perform a comparative evaluation and an analysis on the tunnel oxide films of these memory cells.

BRIEF DESCRIPTION OF THE DRAWINGS

The above and other objects, features and advantages of the present invention will be more apparent from the following description considered with the accompanying drawings, in which.

DESCRIPTION OF THE PREFERRED EMBODIMENTS

Now, embodiments of the present invention will be described with reference to the accompanying drawings.

Figure 1A:
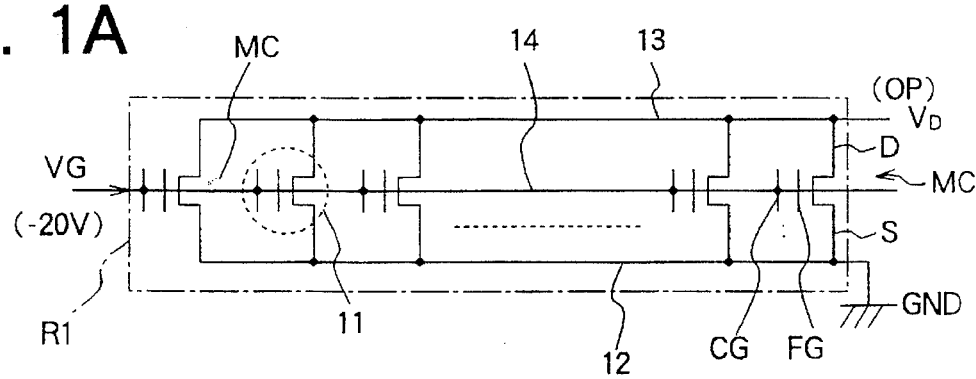
FIGS. 1A and 1B are circuit diagrams of a test block at the steps of a conventional method for testing a nonvolatile semiconductor memory device.
Figure 1B:
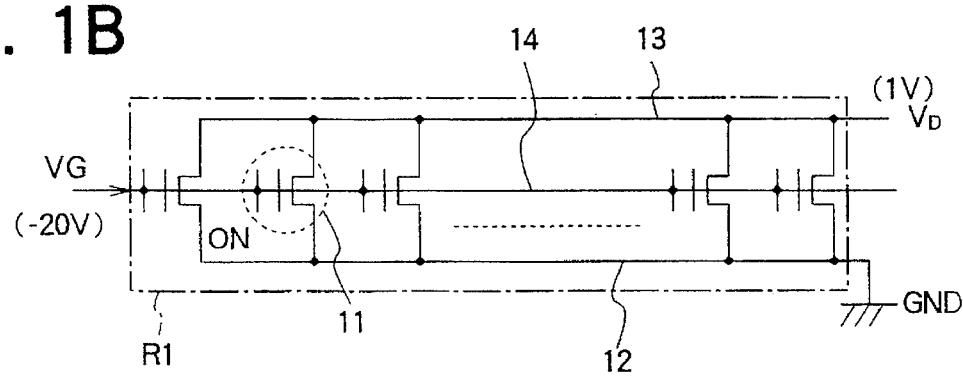
Figure 2:
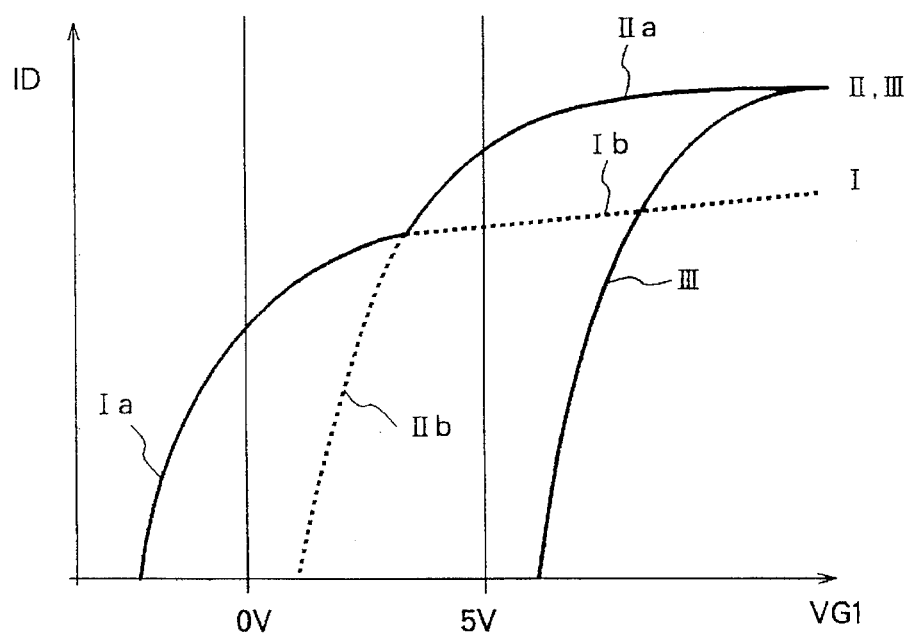
FIG. 2 is a graph for explaining drain current-gate voltage characteristics of memory cells obtained in the conventional test method.
Figure 3:
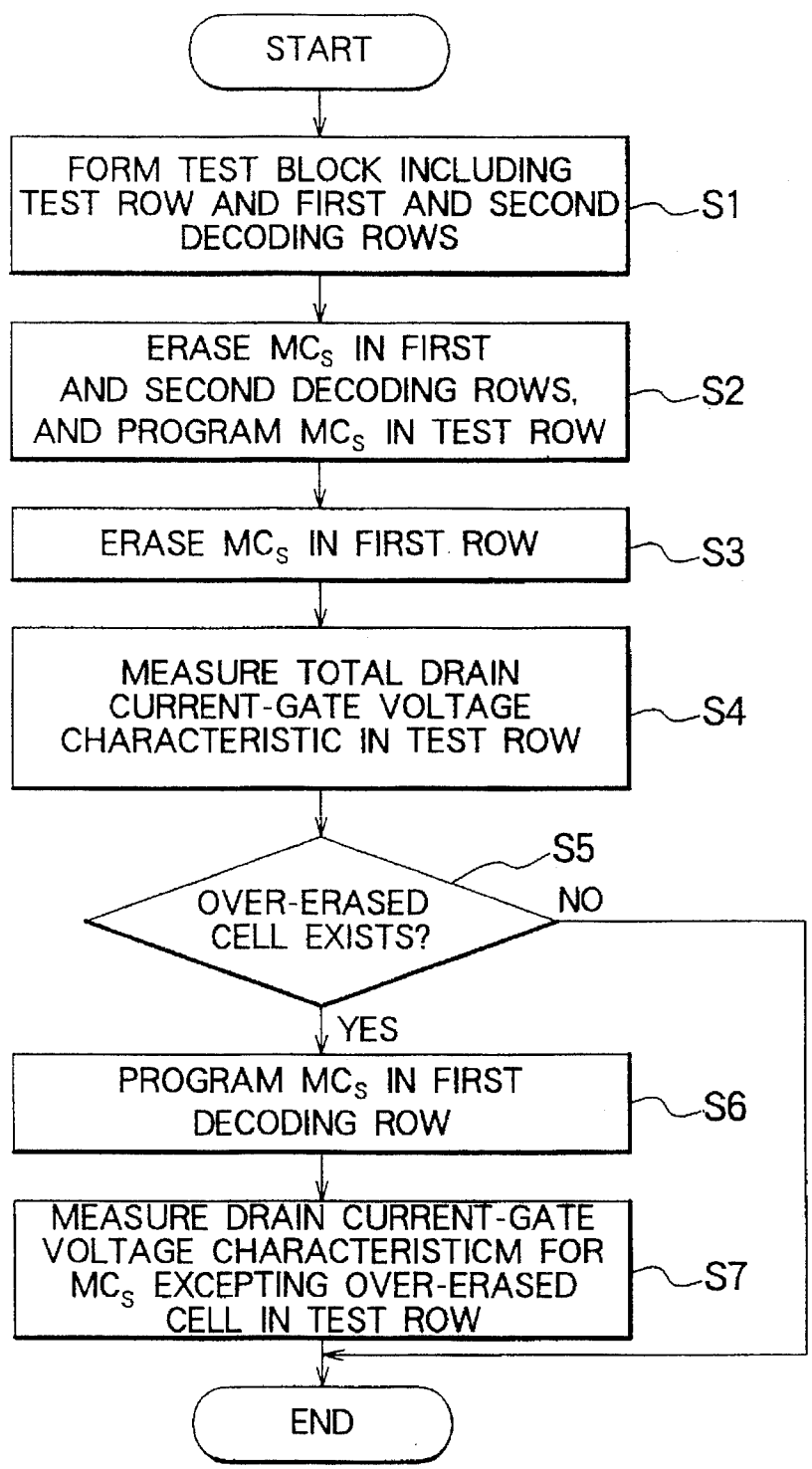
FIG. 3 is a flowchart showing the steps of the test method according to a first embodiment of the present invention.
Figure 4A:
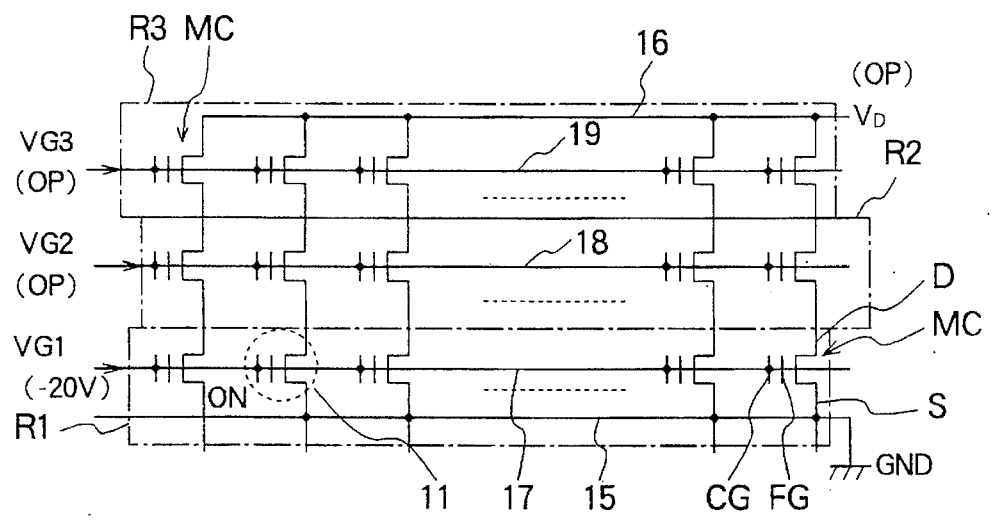
FIGS. 4A, 4B and 4C are circuit diagrams of a test block including a test row and a first and a second decoding rows at the consecutive steps of the method of FIG. 3.
Figure 4B:
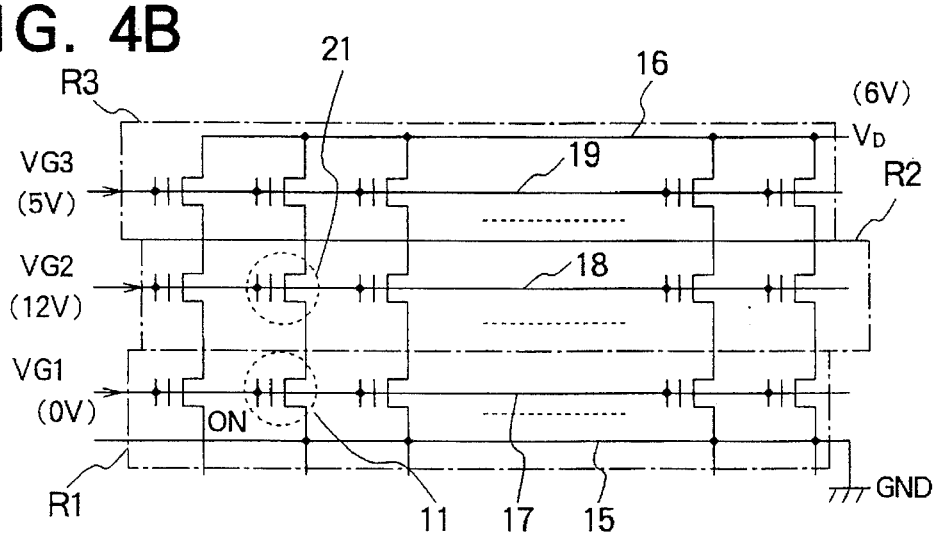
Figure 4C:
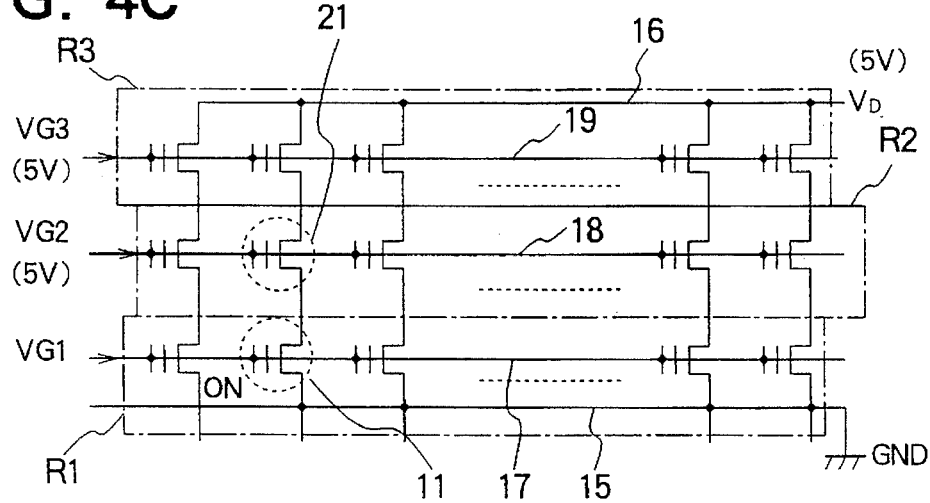
Figure 5:
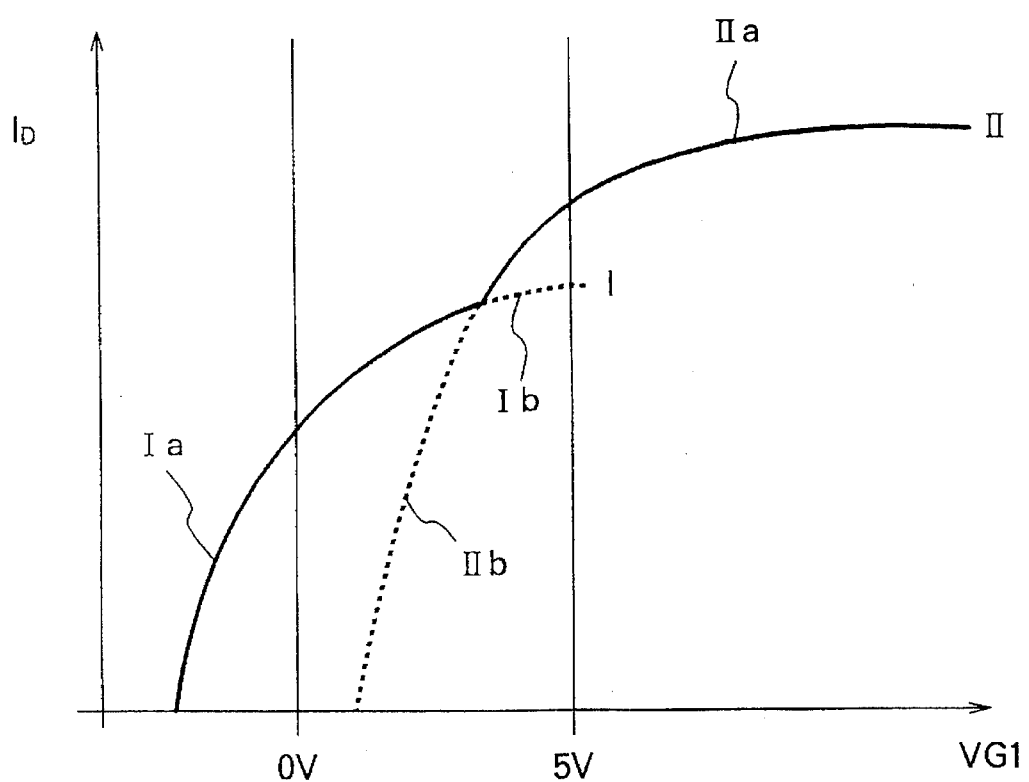
FIG. 5 is a graph for explaining, similarly to FIG. 2, drain current-gate voltage characteristic obtained in the method according to the first embodiment.

FIG. 3 shows a method for testing a nonvolatile semiconductor memory device according to a first embodiment of the present invention, while FIGS. 4A, 4B and 4C show a test block including a test row R1 and two successive decoding rows R2 and R3 at consecutive steps in the method of the present embodiment. The decoding rows R2 and R3 are located adjacent to the test row R1 and used for testing the memory cells MC In the test block R1 in the method. FIG. 5 shows drain current-gate voltage characteristics similarly to FIG. 2

In FIGS. 4A, 4B and 4C, the nonvolatile semiconductor memory device to be tested has a memory cell array including a plurality of memory cells MC arranged in a matrix, namely, in the row and column directions. Each of the memory cells of the memory array is composed of a MOS FET (MC) having a floating gate FG, a control gate CG, a source S and a drain D and capable of storing information by accumulating charge on the floating gate FG. The control gates CG of the memory cells MC in each row are connected together to a word line 17, 18 or 19 in the product.

In the method of the present embodiment, as shown in FIG. 4A, three successive rows R1, R2 and R3 are selected from the memory cell array to form a test block in order to test a desired test row R1 by using decoding rows R2 and R3

The sources S of memory cells MC in tile test row R1 are connected together to form a common source line 15, while each of the drains Of these memory cells MC in the test row R1 are connected to a corresponding one of the sources of the memory cells MC in the first decoding row R2. Also, each of the drains of the memory cells MC in the first decoding row R2 is connected to a corresponding one of the sources of the memory cells MC in the second decoding row R3, and the drains of the memory cells MC in the second decoding row R3 are connected together to a common drain line 16, thereby forming a test block or test row group (step S1 in FIG. 3).

Next, the memory cells MC in each of the rows R1, R2 and R3 are initialized (step S2 in FIG. 3). In detail, all of the memory cells MC in the decoding rows R2 and R3 are erased by applying gate voltages VG2 and VG3 of −20 V to the word lines 18 and 19 and a gate voltage VG1 of 0 V to the word line 17 while maintaining the common drain line 16 at the ground potential. Further, all of the memory cells MC in the test row R1 is programmed by applying a gate voltage VG1 of 20 V to the word line 17 while maintaining the word lines 18 and 19 and the common drain line 16 in the floating state.

Subsequently, as shown in FIG. 4B, the common source line 15 is grounded, and a gate potential VG1 of about −20 V is applied to the word line 17 of the test row so as to erase all of the programmed cells in the test row R1 (step S3 in FIG. 3). The reference symbol "0P" in FIG. 4A and other drawings indicates an open (floating) state of the subject line.

Thereafter, gate potentials VG2 and VG3 of about 5 V are applied to the word lines 18 and 19 of the first and second decoding rows R2 and R3 while the common source line 15 is grounded, thereby turning all of the memory cells MC in the decoding rows R2 and R3 on. Also, a programming supply voltage VD between about 1 V and 5 V is applied to the common drain line 16, and the gate voltage VG1 of the word line 17 of the test row R1 is varied while measuring the total drain current flowing through the common drain line 16, which is the sum of the drain current of all of the memory cells MC in the test row R1 (step S4 in FIG. 3).

FIG. 5 shows the drain current obtained from the test block. In FIG. 5, curve I including the solid line section Ia and broken line section Ib represents the characteristic of the drain current of the over-erased cell while curve II including a solid line section IIa and broken line section IIb represents total drain current including no over-erased cell current. As shown in the drawing, over-erased cell exhibits drain current at a negative gate potential. If an over-erased cell 11 exists in the test row R1, as shown in FIG. 4B, because off the prior overall erasing operation, the total drain current ID varies along a solid section Ia of curve I and then solid section IIa of curve II. On the other hand, if no over-erased cell exists in the test row R1, the total drain current ID varies along a broken line section IIb and then solid line section IIa of curve II. Based on the value of the total drain current ID, especially for the low gate voltage, it is Judged whether or not an over-erased cell 11 exists in the test row R1 (step S5 in FIG. 3).

When it is Judged that an over-erased cell 11 does not exist, the test procedure is closed after other test procedures for testing other characteristics of the test row R1.

If it is judged that the over-erased cell 11 exists, then a gate voltage VG1 of about 0 V is applied to the word line 17 of the test row R1, while the common source line 15 is grounded, so as to force the over-erased cell 11 to be turned on and holding the remaining memory cells in the test row R1 in OFF states. Further, a gate voltage VG3 of about 5 V is applied to the word line 19 of the second decoding row R3 and a supply voltage VD of about 6 V is applied to the common drain line 16 so as to turn the memory cells MC in the second decoding row R3 on. Thereafter, as shown in FIG. 4B, a gate voltage VG2 of about 12 V is applied to the word line 18 of the first decoding row R2 to perform a programming process for the first decoding row R2 by utilizing channel hot electrons (step S6 in FIG. 3). As a result, only the memory cell 21 in the first decoding row R2 which corresponds to the over-erased cell 11 in the test row R1 is programmed, because only the over-erased cell 11 is ON while the remaining memory cells are OFF in the test row R1.

Subsequently, gate voltages VG2 and VG3 of about 5 V are applied to the word lines 18 and 19 of the first and second decoding rows R2 and R3, and a supply voltage VD of between about 1 V and 5 V is applied to the common drain line 16. After grounding the common source line 15, the gate voltage VG1 of the word line 17 of the test row R1 is varied while measuring the total drain current ID flowing through the common drain line 16, as shown in FIG. 4C (step S7 in FIG. 3). As a result, the variation of the total drain current ID of the memory cells MC in the test row R1, excepting the over-erased cell 11, with respect to variation of the gate voltage VG1, can be obtained, as indicated by broken line IIb and solid line IIa of curve II in FIG. 5. In this state, other characteristics of the test row R1 can be measured to complete the test for the test row R1.

As described above, the characteristics of the memory cells, excepting the over-erased cell 11, in the test row R1 can be measured by forming the test block having a relatively simple structure, and by using a relatively simple procedure or test pattern. Accordingly, it is possible to efficiently perform an evaluation, an analysis and the like on the tunnel oxide film of these memory cells MC.

Now, a method for testing a nonvolatile semiconductor memory device according to a second embodiment will be described with reference to FIGS. 6, 7A, 7B, 7C and 8 which correspond FIGS. 3, 4A, 4B, 4C and 5, respectively.

When it is found by the first embodiment that an over-erased cell 11 exists in the test row R1, the characteristics of the over-erased cell 11 are measured in the present embodiment. After the completion of the procedure of the first embodiment, namely, after step 7 in FIG. 3, or else, after step 6 in FIG. 3 when the measurement of the characteristics of memory cells other than the over-erased cell 11 is not necessary, the following procedure is performed.

Figure 6:
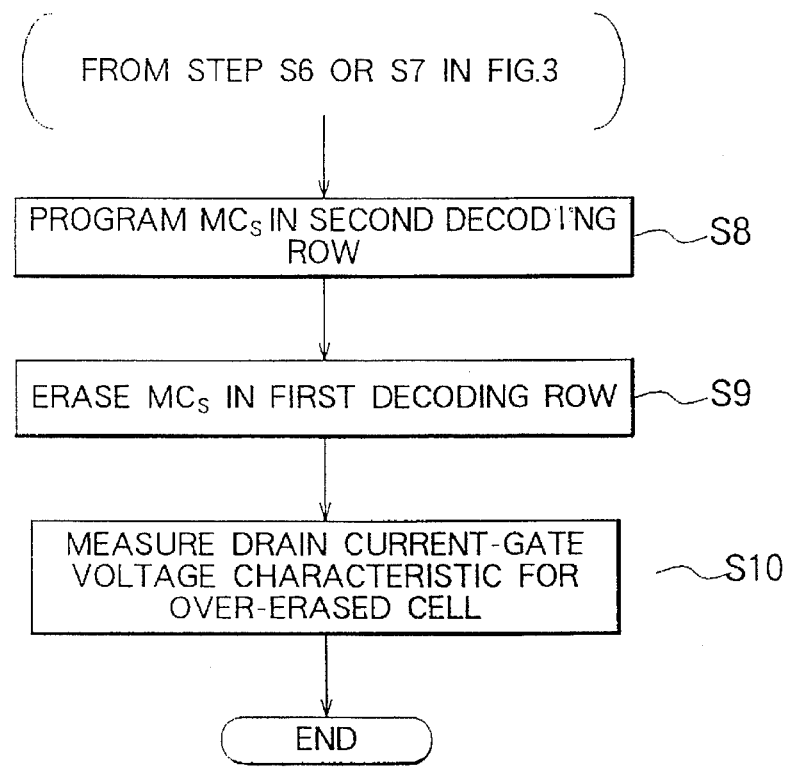
FIG. 6 is a flowchart showing the steps of a test method according to a second embodiment of the present invention following one of the steps in the first embodiment.
Figure 8:
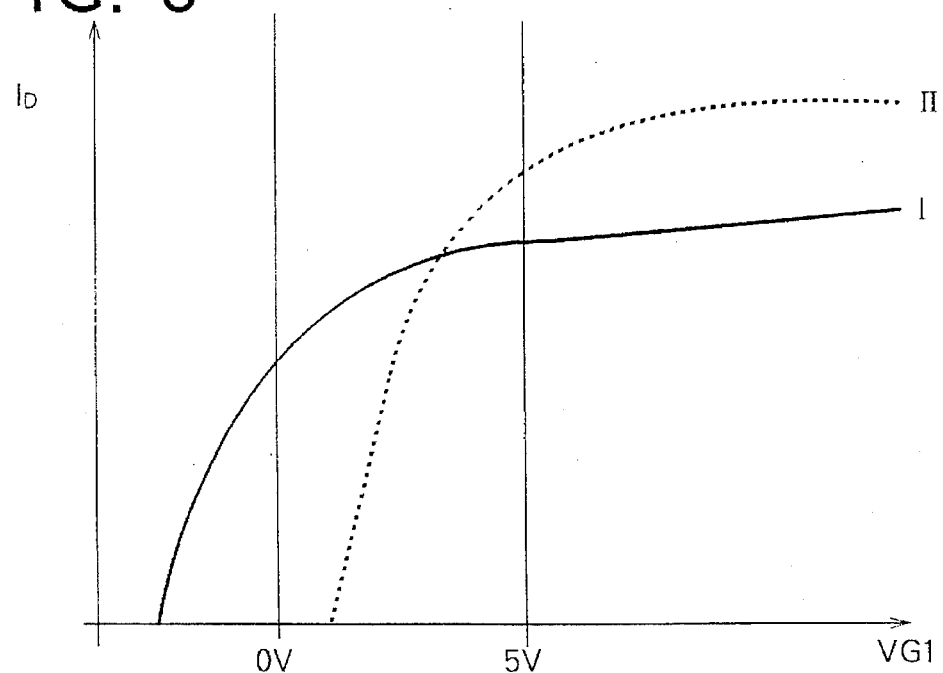
FIG. 8 is a graph for showing, similarly to FIG. 2, drain current-gate voltage characteristic in the test method of FIG. 6.
Figure 7A:
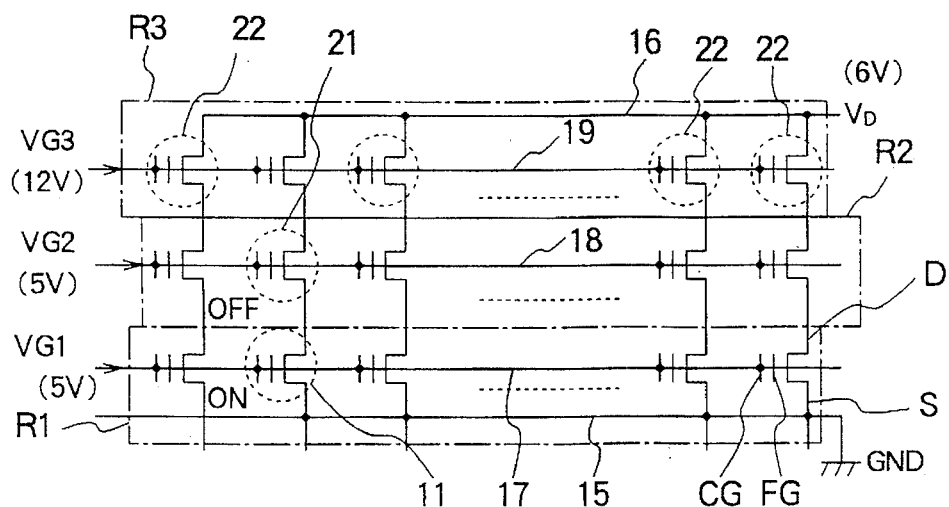
FIGS. 7A, 7B and 7C are circuit diagrams of the test block of FIGS. 4A, 4B and 4C at the steps of the method of FIG. 6.

First, as shown in FIG. 7A, the common source line 15 is grounded, and gate voltages VG1 and VG2 of about 5 V are applied to the word line 17 of the test row R1 and the word line 18 of the first decoding row R2, respectively, to turn on all of the memory cells MC in the test row R1 and the first decoding row R2 other than the programmed cell 21, which corresponds to the over-erased cell 11 in the test row R1. Subsequently, a gate voltage VG3 of about 12 V is applied to the word line of the second decoding row R3 and a programming supply voltage VD of about 6 V is applied to the common drain line 16 so as to perform a programming process for the second decoding row R3 (step S8 in FIG. 6). As a result, all the memory cells MC in the second decoding row R3 other than the memory cell corresponding to the programmed memory cell 21 are programmed to become programmed cells 22.

Figure 7B:
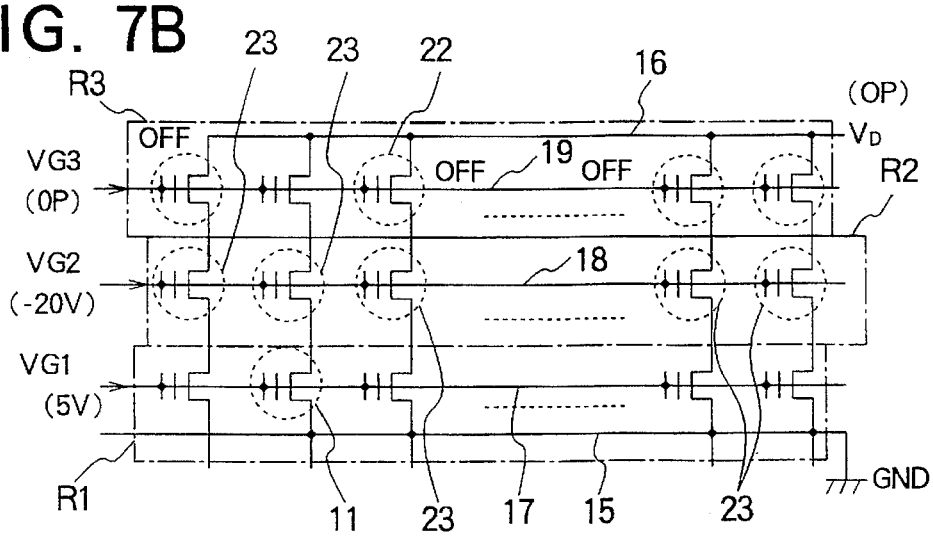

Thereafter, as shown in FIG. 7B, the word line 19 of the second decoding row R3, the common drain line 16, and the word line 17 of the test row R1 are disconnected from respective supply line to be floating (OP), while a gate voltage VG3 of about −20 V is applied to the word line 18 of the first decoding row R2, so as to performing erasure for the first decoding row R2 (step S9, in FIG. 6). As a result, all the memory cells MC in the first decoding row R2 including the programmed cell 21 are erased to become erased cells 23.

Figure 7C:
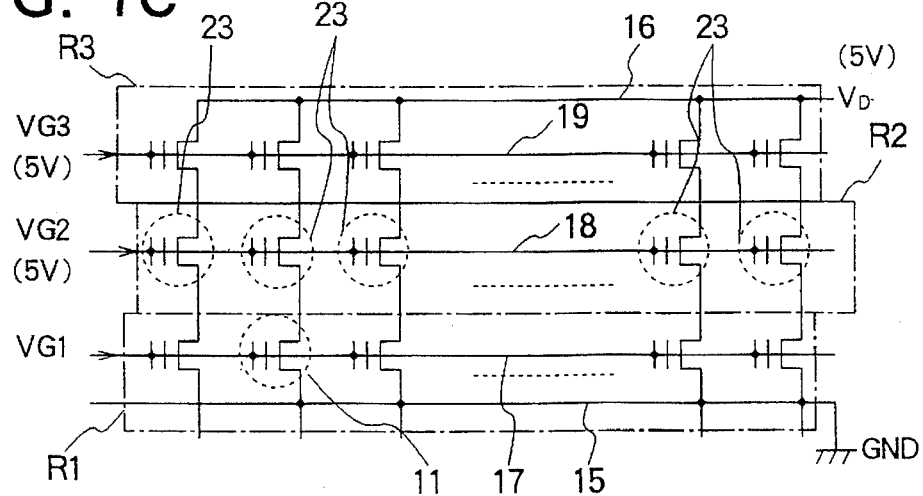

Subsequently, as shown in FIG. 7C, a supply voltage VD of between about 1 V and 5 V is applied to the common drain line 16, while gate voltages VG2 and VG3 of about 5 V are applied to the word lines 18 and 19 of the first and second decoding rows R2 and R3, respectively. After grounding the common source line 16, the voltage (VG1) of the word line 17 of the test row R1 is varied to measure the total drain current ID of the test row (step S10 in FIG. 6). As a result, the variation of the drain current ID of only the over-erased cell 11 in the test row R1, with respect to variation of the gate voltage VG1, can be measured. In this state, other characteristics for the test row R1 can be measured to complete the test.

As described above, the characteristics of the over-erased cell 11 can be measured in the present embodiment by a simple test procedure which follows the test procedure of the first embodiment. Accordingly, it is possible to efficiently perform an evaluation and analysis on the tunnel oxide film of the over-erased cell 11. Also, when the results of the test in the present embodiment is combined with the results obtained by the test in the first embodiment, it is possible to efficiently perform a comparative evolution between the over-erased cell 11 and the remaining memory cells MC.

Since above embodiments are described only for examples, the present invention is not limited to such embodiments and it will be obvious for those skilled in the art that various modifications or alterations can be easily made based on the above embodiments within the scope of the present invention.

For example, the voltages used in the erasing step, the programming step, and the measurement of the characteristics are only examples, and these voltages may be changed depending on the structure of memory cells or the voltage source actually used. Further, although a MOS FET having a floating gate is used as a memory cell in the embodiments, the memory cell may be other transistors, such as MONOS FET which can accumulate charge on an oxide film. Moreover, the row block may be formed by a combination of any rows so long as rows other than the three rows are connected such that memory cells in the other rows act only passing elements. Further, connection for the test block, switchover of the connection, and the application of voltages can be easily performed, by using a test device, in the manner as described above or a modified manner.

What is claimed is:

1. A method for testing a nonvolatile semiconductor memory device having a memory cell array in which a plurality of memory cells are arranged in a matrix, each of said memory cells including a transistor having a control gate, a source, a drain and a charge storing layer capable of storing information by accumulating charge thereon, the control gates of the memory cells in each row being connected together to form a word line, said method comprising the steps of:

forming a test block by selecting three rows including a test row and first and second decoding rows from said memory cell array, connecting the sources of the memory cells in said test row together to form a common source line, connecting each of the drains of the memory cells in said test row to a source of a corresponding one of the memory cells in said first decoding row, connecting each of the drains of the memory cells in said first decoding row to a source of a corresponding one of the memory cells in said second decoding row, and connecting the drains of the memory cells in said second decoding row together to form a common drain line;

erasing the memory cells in said first and second decoding rows, and successively programming and erasing the memory cells in said test row; and after the steps of said erasing and successively programming and erasing, measuring a first drain current flowing through said common drain line with respect to the voltage of the word line of said test row.

2. A method for testing a nonvolatile memory device as defined in claim 1 further comprising the step of judging presence of an over-erased memory cell when said first drain current exhibits a negative threshold voltage.

3. A method for testing a nonvolatile memory device as defined in claim 1 wherein the step of said measuring the first drain current is executed while maintaining said common source line and said common drain line at a reference potential and a first positive potential relative to said reference potential, respectively, and maintaining the transistors of the memory cells in said first and second decoding rows in an ON state.

4. A method for testing a nonvolatile memory device as defined in claim 1 further comprising the steps of:

programming a memory cell in said first decoding row that corresponds to an over-erased memory cell in the test row, if it is judged based on said first drain current that the over-erased memory cell exists, while maintaining the transistors of the over-erased memory cell and remaining memory cell in said test row in ON and OFF states, respectively, and the transistors of the memory cells in said second decoding row in an ON state; and after the step of said programming the memory cell in said first decoding row, measuring a second drain current flowing through said common drain line with respect to the voltage of the word line of said test row, while maintaining said common source line and said common drain line at the reference potential and the first positive potential, respectively, maintaining the transistor of a first memory cell in said first decoding row connected to an over-erased memory cell in an OFF state, and maintaining the transistors of the memory cells in said first decoding row other than said first memory cell and the transistors of the memory cells in said second decoding row in an ON state.

5. A method for testing a nonvolatile memory device as defined in claim 4 further comprising the steps of:

programming the memory cells in said second decoding row except the memory cell that corresponds to said over-erased memory cell in said test row;

erasing the memory cells in said first decoding row; and after the step of said programming the memory cells in said second decoding row and erasing the memory cells in said first decoding row, measuring a third drain current flowing through said common drain line with respect to the voltage of the word line of said test row, while maintaining said common source line and said common drain line at the reference potential and the first positive potential, respectively, maintaining the transistor of a second memory cell in said second decoding row connected to the over-erased memory cell in an ON state, and maintaining the transistors of the memory cells in said first decoding row and the transistors of the memory cells in said second decoding row other than said second memory cell in ON and OFF states, respectively.

* * * * *